United States Patent
Koegel et al.

[19]

[11] Patent Number: 5,405,267
[45] Date of Patent: Apr. 11, 1995

[54] BOARD-MOUNTING RACK FOR PLURALITY OF ELECTRICAL CONNECTORS

[75] Inventors: Keith S. Koegel, Plainfield; Christo S. Nikoloff, Lititz, both of Pa.

[73] Assignee: The Whitaker Corporation, Wilmington, Del.

[21] Appl. No.: 218,782

[22] Filed: Mar. 28, 1994

[51] Int. Cl.$^6$ .............................................. H01R 9/09
[52] U.S. Cl. ...................................... 439/79; 439/571
[58] Field of Search .................. 428/99, 120; 439/55, 439/79–84, 547, 555, 557, 571, 572

[56] References Cited

U.S. PATENT DOCUMENTS

| | | | |
|---|---|---|---|
| 5,198,279 | 3/1993 | Beinhaur et al. | 428/99 |
| 5,238,413 | 8/1993 | McCaffrey et al. | 439/79 |
| 5,354,207 | 10/1994 | Chikano | 439/79 |

OTHER PUBLICATIONS

AMP Incorporated Drawing No. 93-3483-002, "Assembly, Jack, Launcher, SMA" (Jan., 1993); AMP Incorporated, Harrisburg, Pa.

*Primary Examiner*—Khiem Nguyen
*Attorney, Agent, or Firm*—Anton P. Ness

[57] ABSTRACT

A mounting rack (10) for a plurality of electrical connectors (50) to define a subassembly (90) manipulatable as a unit for mass connector mounting to a circuit board (100) at an edge (102) thereof. A premolded mounting rack (10) includes slots (22) at each connector site (20) into which respective connectors (50) are insertable to become secured to the mounting rack, prior to mounting of the subassembly to the circuit board and subsequent electrical connection of contact sections (64,66,68) of each connector being connected to circuit termini of the board (100). Projections (32) from the mounting rack (10) include embossments (34) or fastening elements (150) adapted to enter or pass through mounting holes (110,164) of the board for securing the subassembly to the board. The mounting rack (200) may also be overmolded about intermediate portions of the connectors to define a subassembly.

9 Claims, 5 Drawing Sheets

5,405,267

BOARD-MOUNTING RACK FOR PLURALITY OF ELECTRICAL CONNECTORS

FIELD OF THE INVENTION

The present invention relates to the field of electrical connectors and more particularly to the mounting of connectors to a circuit board.

BACKGROUND OF THE INVENTION

Coaxial electrical connectors for coaxial cable termination are commercially available that are mountable to a circuit board at an edge thereof, and each includes an inner or signal contact secured within a dielectric sleeve and surrounded by an outer conductor. The signal contact includes a contact section or post extending from a board-proximate end, and a plurality of ground contact sections or posts are arrayed therearound extending from the outer conductive connector shell, solderable to respective circuits of the circuit board that extend to termini adjacent the board's edge. One such product is sold by AMP Incorporated under Part No. 93-3483-002, and conventionally the product is assembled to the circuit board by manual soldering techniques.

It is desired to provide for mounting of connectors to a circuit board in an economical manner.

SUMMARY OF THE INVENTION

The present invention is an elongate mounting rack having connector sites spaced therealong, with each connector site adapted for securing a respective coaxial connector to the mounting rack thereat. The mounting rack with connectors secured thereto defines a subassembly manipulatable as a unit, and is subsequently self-securable to a circuit board at an edge thereof prior to soldering of the terminals of the connectors to circuit termini of the circuit board. The connector sites of the mounting rack are associated with the arrays of termini of circuits of the circuit board adjacent the edge thereof, such that upon securing the mounting rack to the circuit board at the edge, the arrays of signal and ground contact sections are adjacent respective ones of the termini enabling mass soldering techniques to be utilized simplifying connector-to-board assembly and reducing costs.

Preferably the mounting rack includes at least two spaced apart mounting projections associated with mounting holes of the circuit board positioned at preselected locations with respect to the arrays of circuit termini, such that upon mounting of the mounting rack to the board edge, the connector sites are adjacent the respective termini arrays. The projections include embossments on free ends to become seated within respective ones of the board mounting holes, and the projections may be outwardly deflectable spring arms. As the mounting rack/connector subassembly is moved parallel to the circuit board and against the board edge with the signal and ground contact sections in upper and lower rows straddling the thickness of the board, rounded (or angled) surfaces of the embossments engage the board edge and adjacent surface causing the spring arms deflect away from the board's mounting surface upon bearing of the ends of the embossments along the mounting surface until reaching the mounting holes spaced inwardly from the board edge, whereupon the embossments enter the respective mounting holes and the spring arms resile against the board's mounting surface. The projections and their embossments in cooperation with the upper and lower rows of contact sections sufficiently secure the mounting rack to the board for performance of a mass soldering operation to solder the signal and ground contact sections of the plurality of connectors to respective ones of the circuit termini of the circuit board.

In another aspect of a first embodiment of the present invention, each connector site of the mounting rack defines a slot into a common lateral edge of a transverse body section of the mounting rack. The bottom of the slot is shaped to corresponding with a side surface of a coaxial connector, and an entrance to the slot is profiled to define a constriction adjacent the slot proper that is dimensioned to be slightly smaller than the corresponding dimension of the connector. Each connector is inserted laterally into the slot entrance and is forcefit or snapped past the constriction and into the slot proper, with the constriction thus retaining the connector within the slot proper. Preferably a ledge along the opposite edge of the transverse body section of the mounting rack is engaged by a larger dimensioned connector portion upon insertion of the connector into a respective slot, angularly stabilizing the respective connectors in position within the slots.

Also, a mounting rack may be fabricated having many such connector sites therealong with a plurality of spring arms containing mounting projections, with frangible sections defined along the length enabling portions of the mounting rack to be easily separated into shorter lengths having a desired number of connector sites and mounting projections.

Another embodiment of the mounting rack involves molding the mounting rack to the plurality of electrical connectors held within the mold cavity at appropriate spacing in appropriate orientation, to define an integral multiconnector subassembly.

It is an object of the present invention to provide a mounting rack having a plurality of connector sites each adapted to receive a connector securably thereat, to define a subassembly manipulatable as a unit for mass connector mounting to a circuit board edge.

It is an additional objective to provide such a mounting rack to be easily mountable to a circuit board edge where the connectors each have contact sections associated with opposed surfaces of the circuit board, for soldering to respective circuit termini to define assured electrical connections therewith.

It is also an objective to provide an elongate mounting rack having many connector sites, easily separable into shorter mounting rack segments as desired by providing frangible sections at appropriate locations.

An embodiment of the present invention will now be described by way of example with reference to the accompanying drawings.

DETAILED DESCRIPTION OF THE PREFERRED EMBODIMENT

Figure 1:
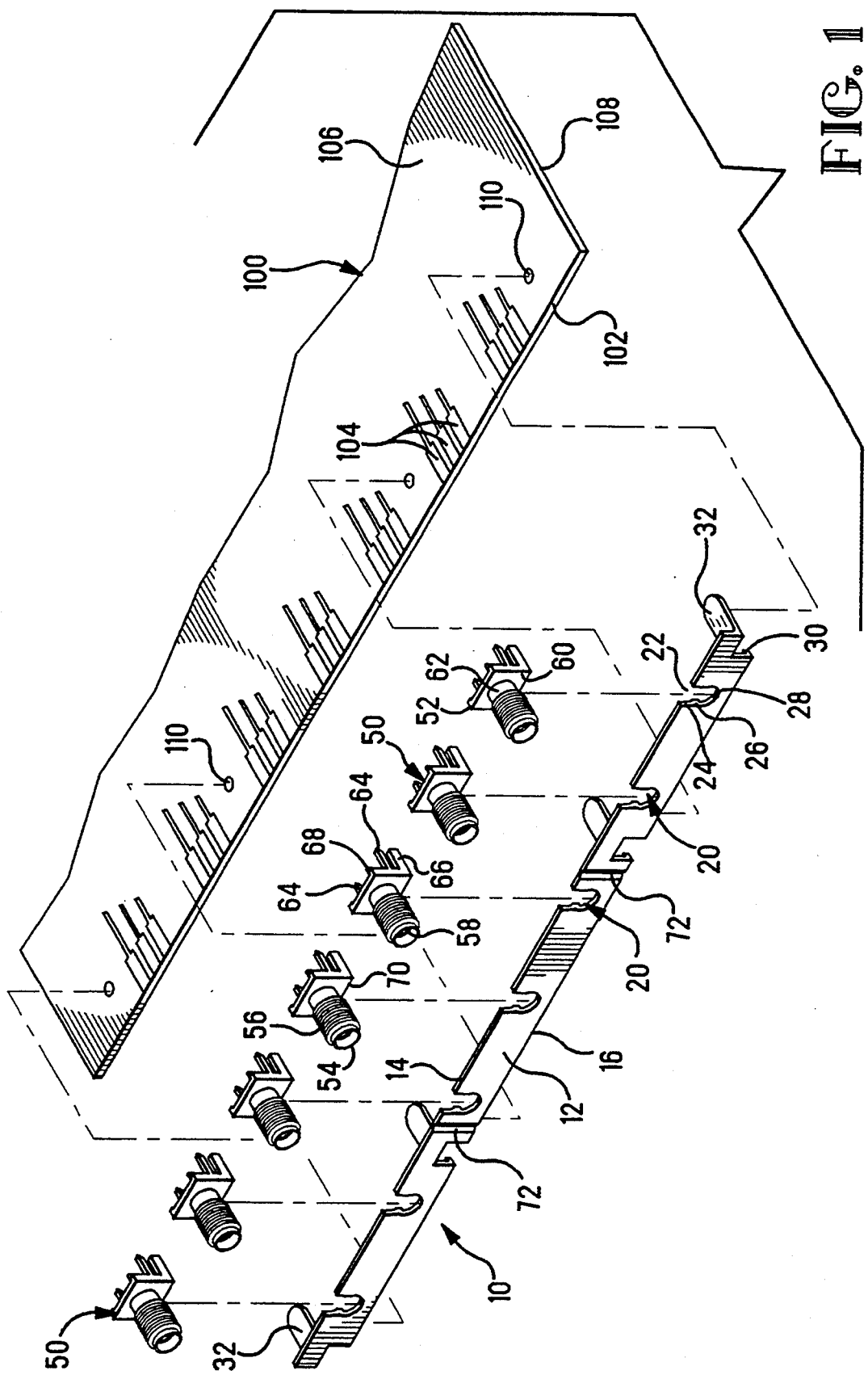
FIG. 1 is an isometric view of the mounting rack of the present invention with an array of coaxial connectors exploded from connector sites thereof, and showing an edge portion of a circuit board prior to mounting thereto.

In a first embodiment of the present invention shown in FIGS. 1 to 8, mounting rack 10 is an elongate member having a transverse body section 12 extending between mounting edge 14 and opposed edge 16 laterally therealong. A plurality of coaxial connectors 50 is shown that are to be mounted to circuit board 100 at edge 102, with circuits of the board extending to respective termini 104 adjacent edge 102 on upper and lower major surfaces 106,108. Mounting holes 110 are seen spaced along board edge 102 and spaced a selected distance inwardly therefrom.

Connector sites 20 are defined at slots 22 having entrances 24 extending into mounting edge 14 past constrictions 26 and including connector-mounting portions 28. The plurality of coaxial connectors 50 are associated with respective connector sites 20, and each includes an inner or signal contact secured within a dielectric sleeve all within an outer conductive shell 52. Cylindrical mating end 54 of outer conductive shell 52 is threaded along its outer surface 56 to which a rotatable coupling ring of a mating coaxial connector (not shown) is threadable for being mated therewith, with a plug-receiving cavity 58 exposing the signal contact for mating with the complementary signal contact of the mating connector.

Figure 5:
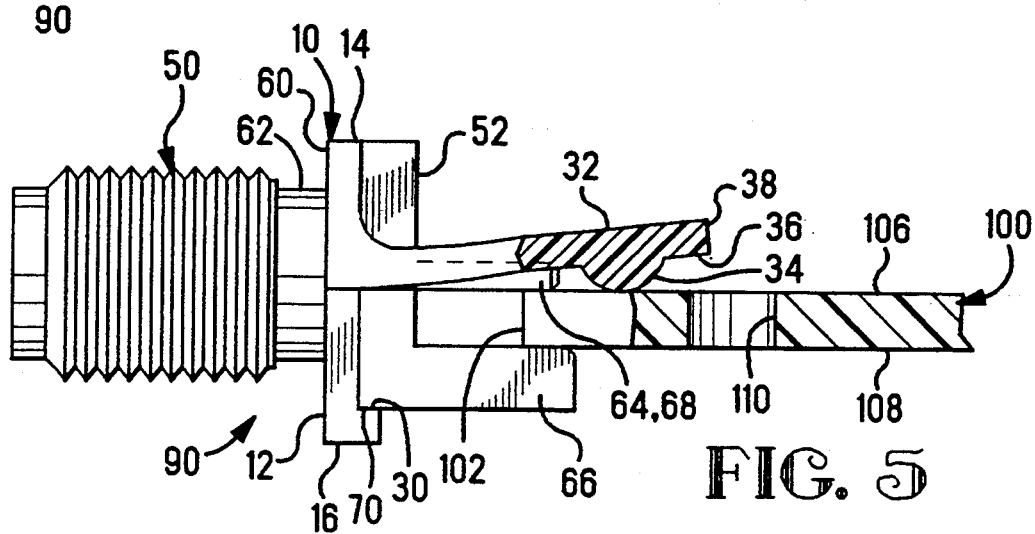
FIGS. 5 and 6 are cross-sectional views of the mounting rack of FIG. 1 having a connector secured at a connector site thereof, during board mounting and after full mounting respectively.

Each outer conductive shell 52 of the connectors is shown to include a transverse rectangular plate section 60 rearwardly of intermediate cylindrical section 62, and rearwardly from plate section extend an array of ground contact sections 64,66 surrounding a signal contact section 68, with reference to FIGS. 1 and 5. First ones 64 of the ground contact sections coextend rearwardly in a plane with signal contact section 68 defining a first or upper row, while second ones 66 of the ground contact sections coextend rearwardly in a second or lower row in a plane parallel to that containing contact sections 64,68 and spaced therefrom a distance equal to the nominal thickness of circuit board 90. The planes of contact sections 64,68 and 66 define a gap therebetween for receipt of the edge portion of a circuit board therebetween, for the contact sections to be soldered to respective circuit termini disposed on upper and lower surfaces of the circuit board, whereafter the coaxial connector is mechanically fastened to the board edge in a stable arrangement. Such coaxial connectors are shown to be of the type commercially available under Part No. 93-3483-002 from AMP Incorporated, Harrisburg, Penna.

Figure 2:
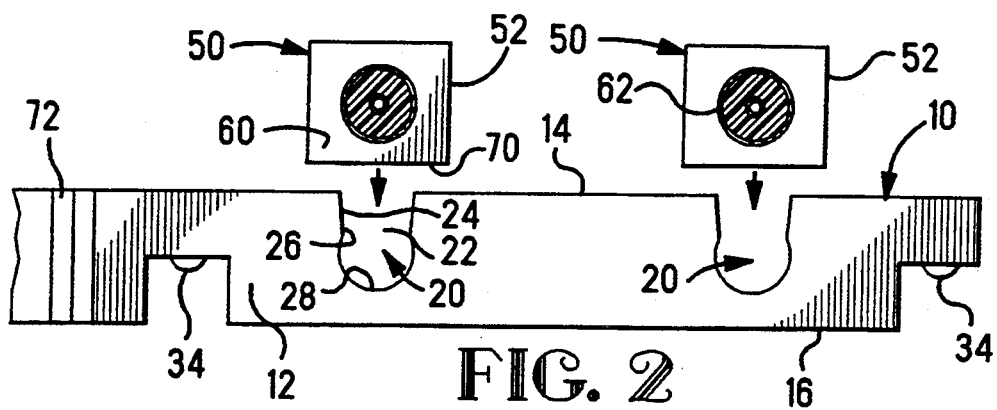
FIGS. 2 and 3 are front elevational views of a portion of the mounting rack of FIG. 1 with pair of connectors being secured thereto.
Figure 3:
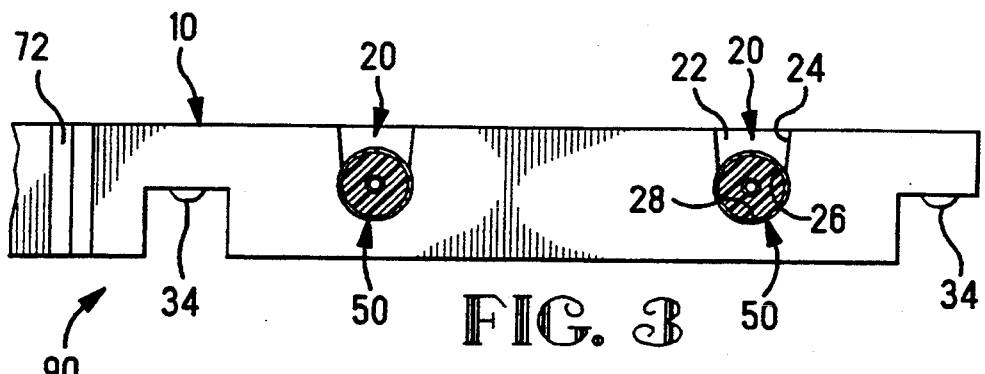

FIGS. 2 and 3 illustrate the securing of coaxial connectors 50 to mounting rack 10 at respective connector sites 20. Intermediate cylindrical section 62 of each connector is urged into an entrance 24 along mounting edge 14 of transverse body section 12, with sides of the entrance preferably diverging to define a lead-in facilitating connector insertion thereinto. As intermediate section 62 reaches constriction 26, it is forcefit therepast and into connector-securing portion 28 of slot 22, with transverse plate sections 60 of outer conductive shells 52 disposed along the board-proximate side of transverse body section 12 of mounting rack 10. A lower surface 70 of plate section 60 abuts a ledge 30 of mounting rack 10 along lower edge 16 thereof, as seen in FIGS. 5 and 6, effecting angular stabilization of connectors 50 when secured in the mounting rack.

Figure 4:
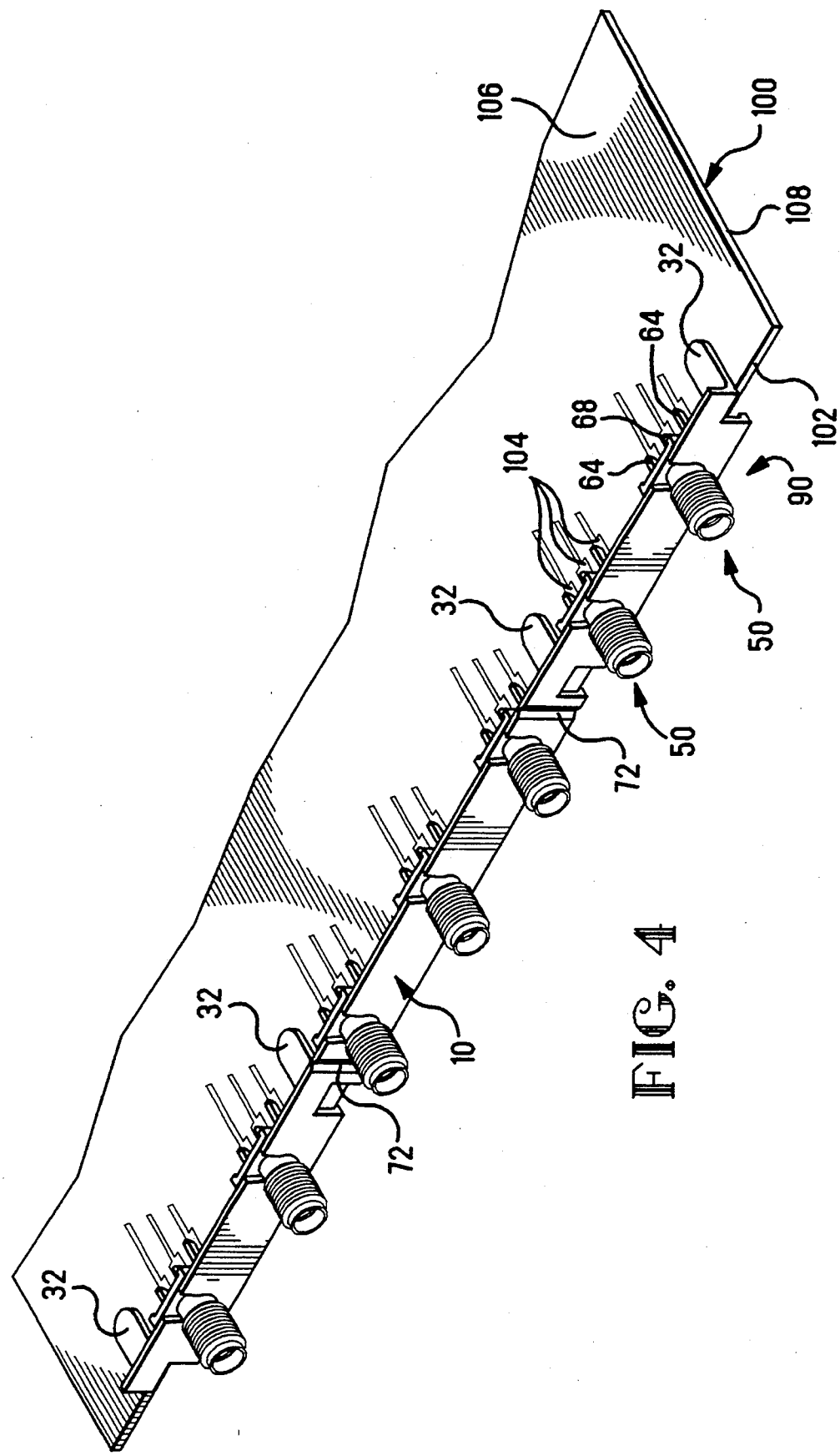
FIG. 4 is an isometric view of the mounting rack of FIG. 1 with the connectors secured thereto, and mounted to the circuit board edge.

In FIG. 4, coaxial connectors 50 are shown to be secured to mounting rack 10 at connector sites 20 to define a subassembly 90 manipulatable as a unit for mass mounting of the plurality of connectors 50 to circuit board 100 along edge 102. Mounting rack 10 is shown to include a plurality of spring arms 32 extending rearwardly from transverse body section 12 at locations corresponding to locations of mounting holes 110 of circuit board 100.

Figure 6:
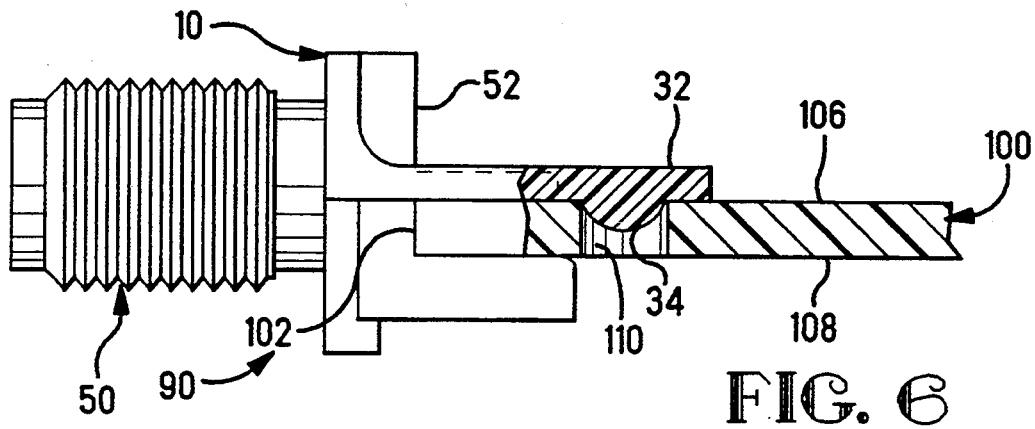

As seen in FIGS. 5 and 6, each spring arm 32 is disposed in the plane of ground contact sections 64 and signal contact section 68. Fastening elements such as embossments 34 are defined on board-proximate surfaces 36 of spring arms 32 and are shaped and dimensioned to be received into respective mounting holes 110 upon full mounting of mounting rack 10 to circuit board 100 at edge 102. Initially as mounting rack is aligned with the plane of circuit board 100 and moved against edge 102, board edge 102 is received between the upper and lower rows defined by contact sections 64,66,68, with leading ends 38 of spring arms deflected away from mounting surface 106 of circuit board 100 as preferably rounded embossments 34 bear against the board mounting surface. Upon full movement of subassembly 90 against edge 102, embossments 34 enter respective mounting holes 110 and spring arms 32 resile against mounting surface 106 of circuit board 100. The receipt of embossments 32 into mounting holes 110 provides a means for securing subassembly 90 to circuit board 100 until electrical connection of signal contact sections 68 and ground contact sections 64,66 of coaxial connectors 50 to respective termini 104 of circuits of circuit board 100. Embossments seated within the mounting holes cooperates with the upper and lower contact section rows along the upper and lower surfaces of the circuit board, to hold the subassembly to the circuit board edge in a manner preventing any rotation of the subassembly during handling. Preferably the electrical connection of the contact sections to the circuits of the board is performed in a mass soldering technique such as reflow soldering, enabled by use of the present invention.

Mounting rack 10 is preferably molded of thermoplastic resin such as ULTEM 2300 polyolefin sold by General Electric Company, or VALOX polyester resins sold by General Electric Company, or a polycarbonate resin. If preferred, mounting rack can be fabricated to be conductive, by providing a metal or other conductive plating or coating on the surfaces of mounting rack member molded of suitable platable plastic resin by conventional techniques, serving as a ground circuit for the outer conductive shells of the coaxial connectors and engageable with ground circuits of the circuit board.

Further, mounting rack 10 is shown to include shallow V-shaped grooves 72 vertically along transverse body section 12 thereof, spaced therealong with two or three connector sites 20 therebetween. Grooves 72 define frangible sections permitting a many-position mounting rack 10 to be broken by careful manipulation into smaller rack sections for two or three connectors, as desired, so long as the smaller rack section desired includes a pair of spring arms 32 for facilitating initial securing of a mounting rack/connector subassembly to a circuit board edge prior to soldering.

Figure 7:
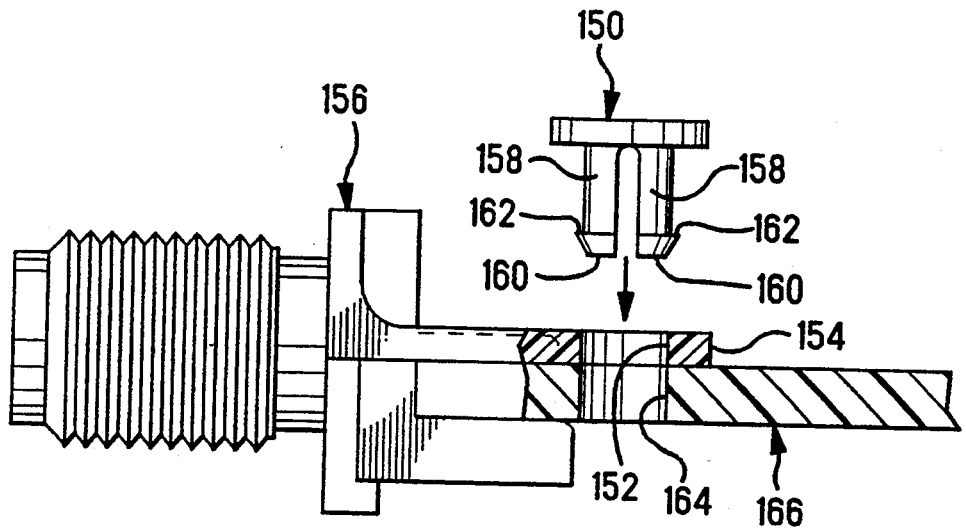
FIGS. 7 and 8 are alternate embodiments of fastening projections of the mounting rack of FIG. 1.
Figure 8:
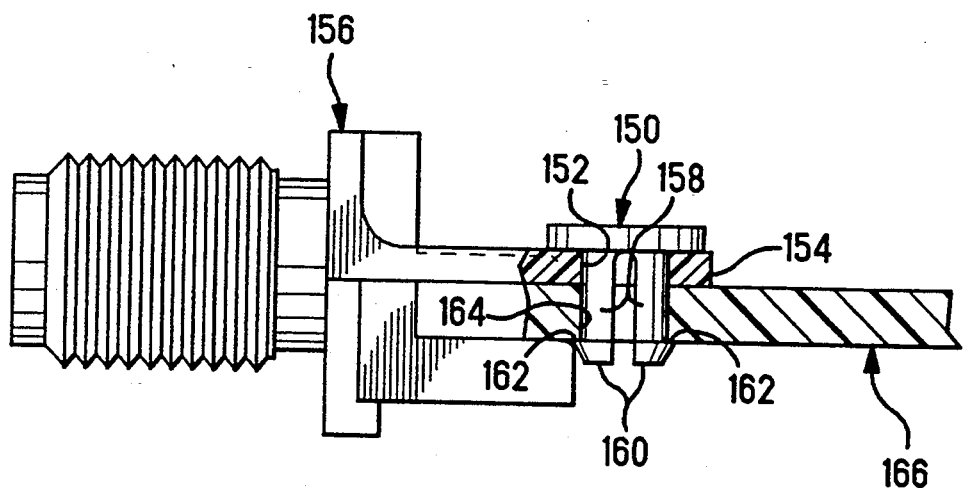

An alternate form of projection for securing the mounting rack/connector subassembly to the circuit board is illustrated in FIGS. 7 and 8. Separate fasteners 150 may be inserted through apertures 152 in spring arms 154 of mounting rack 156, securing the spring arms and thus the subassembly to the circuit board. Fasteners 150 include a pair of beams 158 coextending to free ends 160, with widened portions 162 engageable with side surfaces of mounting holes 164 of circuit board 166, deflecting beams 158 together until widened portions 162 pass through mounting holes 164 whereafter beams 158 resile for widened portions to engage beneath the lower surface of circuit board 166 thus securing mounting rack 156 to the circuit board.

Figure 9:
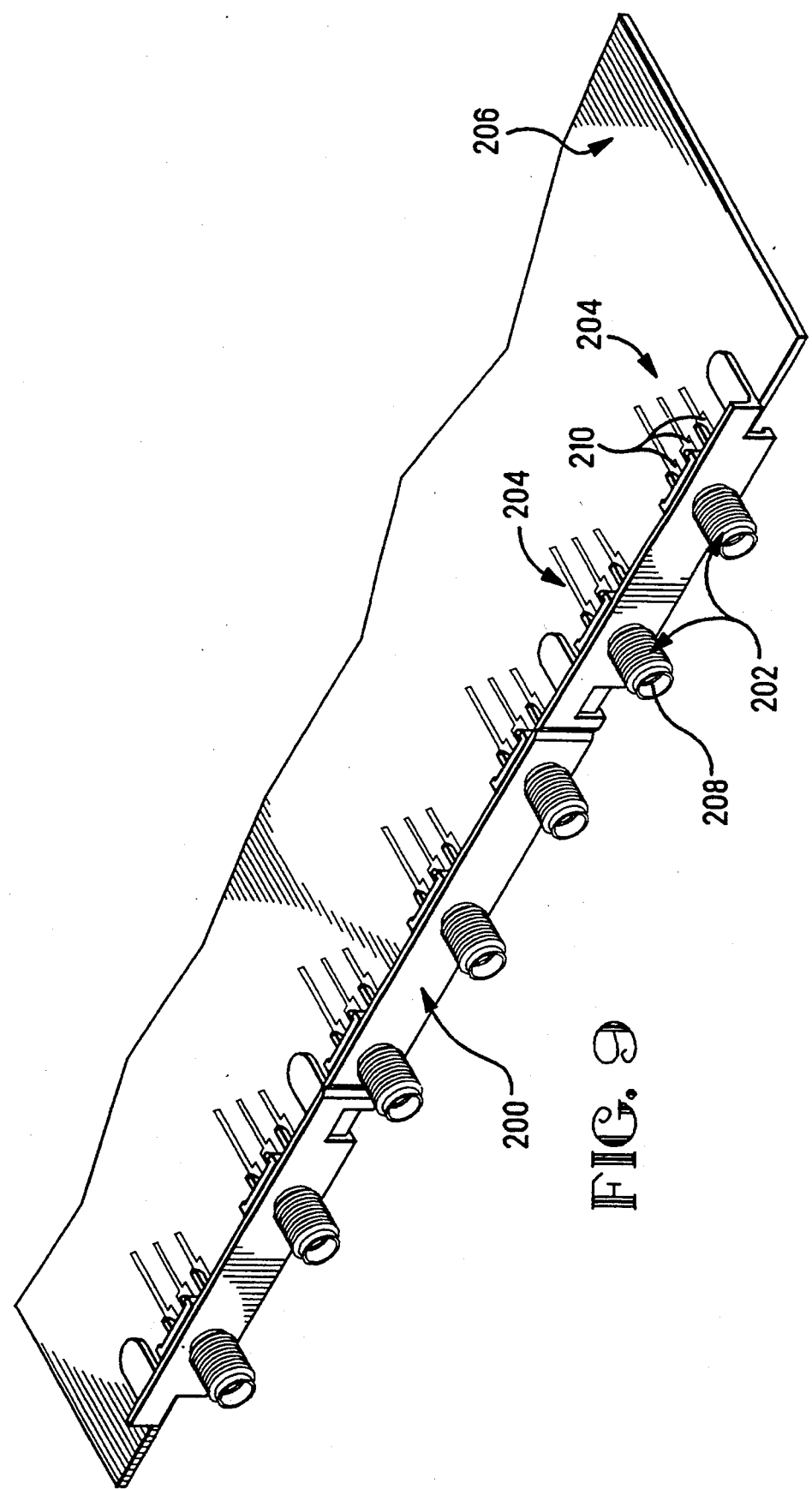
FIG. 9 is an alternate embodiment of the present invention wherein a mounting rack is molded directly to and around the plurality of connectors.

In another embodiment of the present invention illustrated in FIG. 9, a mounting rack/connector subassembly 200 may be fabricated by molding the mounting rack body to the plurality of connectors 202 held in the mold (not shown) properly positioned at connector sites corresponding to termini arrays 204 of the circuit board 206. The insert molding process, which is a conventional technique, thus firmly secures the connectors to the rack by embedding intermediate portions of the connector bodies within the plastic material, while exposing the mating face 208 and the contact sections 210 of the connectors for connector mating and board connecting respectively.

Variations and modifications may be made to the specific embodiment disclosed herein, that are within the spirit of the invention and the scope of the claims. For example, the mounting rack of the present invention can be modified to accommodate other designs of electrical connectors, such as connectors containing terminals having rows of spring arm contact sections to be soldered to the circuit board termini, or electrically connected thereto by other means such as compressive forces or conductive epoxy.

We claim:

1. A mounting rack for mass mounting of a plurality of electrical connectors to an edge portion of a circuit board for contact sections of each connector to be electrically connected to respective circuit termini of the circuit board along the edge thereof, comprising:

a one-piece member having a transverse body section with an upper edge and a lower edge and a plurality of projections extending from a board-proximate surface of said transverse body section associated with mounting holes of a circuit board adjacent an edge thereof, and each said projection having a fastening protrusion at least securable thereto to extend therefrom at least into a respective said mounting hole;

said transverse body section including an array of connector sites spaced therealong associated with arrays of circuit termini of said circuit board adjacent said edge thereof, each said connector site including a connector-receiving slot into said upper edge permitting receipt thereinto of an associated electrical connector; and each said connector-receiving slot including a constriction smaller in dimension than an associated portion of a said connector such that connector must be forcefit therepast to become seated within a connector-securing portion of said slot, whereby a plurality of said connectors are securable to said mounting rack defining a subassembly prior to being mounted onto said circuit board, with said subassembly manipulatable as a unit for facilitating mass mounting of said plurality of said connectors to an edge of said circuit board by movement of said mounting rack toward said edge until fastening protrusions of said projections seat in said mounting holes for initial securing of said subassembly to said circuit board.

2. The mounting rack as set forth in claim 1 wherein said fastening protrusions are embossments integral with said projections shaped to enter respective mounting holes, and said projections are resiliently deflectable during mounting of said mounting rack to said circuit board until said embossments are seated within said mounting holes.

3. The mounting rack as set forth in claim 2 wherein said embossments are rounded.

4. The mounting rack as set forth in claim 1 wherein said fastening protrusions are discrete fastening devices adapted to be inserted through apertures in respective said projections and including latching projections adapted to be forced through respective said mounting holes of said circuit board to latchingly engage with said circuit board upon full insertion.

5. The mounting rack as set forth in claim 1 wherein said mounting rack includes a ledge adapted to be engaged by a portion of each said connector upon full mounting thereof to said mounting rack, stabilizing the position of said connector upon being secured to said mounting rack.

6. The mounting rack as set forth in claim 1 wherein said mounting rack is elongate having more than two said connector sites and includes at least one frangible section adapted to permit breaking of said mounting rack thereat to define a smaller mounting rack section having fewer connector sites.

7. A multiconnector assembly mountable to an edge of a circuit board for electrical connection of contact sections of a plurality of connectors to respective termini of the circuit board adjacent the edge thereof, comprising:

a mounting rack having a transverse body section and a plurality of integrally formed projections extending from a board-proximate surface of said transverse body section associated with mounting holes of a circuit board adjacent an edge thereof, and each said projection having a fastening protrusion at least securable thereto to extend therefrom at least into a respective said mounting hole; and said transverse body section including an array of connector sites spaced therealong associated with arrays of circuit termini of said circuit board adjacent said edge thereof, each said connector site including a respective electrical connector extending through an aperture therethrough, whereby a plurality of said connectors are held by said mounting rack defining a subassembly prior to being mounted onto said circuit board, with said subassembly manipulatable as a unit for facilitating mass mounting of said plurality of said connectors to an edge of said circuit board by movement of said mounting rack toward said edge until fastening protrusions of said projections seat in said mounting holes for initial securing of said subassembly to said circuit board.

8. A multiconnector assembly as set forth in claim 7 wherein said mounting rack is molded about intermediate sections of said connectors such that mating faces of said connectors are exposed to become mated with complementary connectors, and contact sections of said connectors coextend therefrom for electrical connection to respective circuit termini of a circuit board.

9. A multiconnector assembly as set forth in claim 7 wherein said mounting rack is molded as a discrete element having slots thereinto from an edge at each said connector site, whereinto respective said connectors are insertable to be secured therein.

* * * * *